US007272554B2

(12) United States Patent
Serizawa et al.

(10) Patent No.: US 7,272,554 B2

(45) Date of Patent: Sep. 18, 2007

(54) REDUCTION OF SPEECH QUALITY DEGRADATION CAUSED BY PACKET LOSS

(75) Inventors: Masahiro Serizawa, Tokyo (JP); Yoshiaki Nozawa, Tokyo (JP)

(73) Assignee: NEC Corporation, Tokyo (JP)

(*) Notice: Subject to any disclaimer, the term of this patent is extended or adjusted under 35 U.S.C. 154(b) by 885 days.

(21) Appl. No.: 10/418,202

(22) Filed: Apr. 18, 2003

(65) Prior Publication Data

US 2003/0200083 A1 Oct. 23, 2003

(30) Foreign Application Priority Data

Apr. 19, 2002 (JP) ............................ 2002-117187

(51) Int. Cl.
*G10L 19/00* (2006.01)
*H03M 13/00* (2006.01)

(52) U.S. Cl. ...................................................... 704/219

(58) Field of Classification Search ................. 704/219
See application file for complete search history.

(56) References Cited

U.S. PATENT DOCUMENTS 5,897,615 A * 4/1999 Harada ....................... 704/214
6,952,668 B1 * 10/2005 Kapilow ..................... 704/228
6,973,425 B1 * 12/2005 Kapilow ..................... 704/228

OTHER PUBLICATIONS

Peter Kroon et al., "Performance of the Proposed ITU-T 8 KB/S Speech Coding Standard for a Rayleigh Fading Channel"; IEEE Proc. Speech Coding Workshop; (1995) pp. 11-12.

Shuji Kubota, "Improved ADPCM Voice Signal Transmission Employing Click-Noise Detection Scheme for TDMA-TDD Personal Communication Systems"; IEEE Trans. on Vehicular Technology, vol. 46, No. 1, (Feb. 1997) pp. 108-113.

Manfred R. Schroeder, et al., "Code-Excited Linear Prediction (CELP): High-Quality Speech at Very Low Bit Rates"; IEEE Proc. ICASSP-85 (1985), pp. 937-940.

W.R. Daumer, et al., "Overview of the ADPCM Coding Algorithm"; IEEE Proc. of GLOBECOM 1984, pp. 774-777.

"7kHz Audio-Coding Within 64 KBIT/S"; ITU-T Recommendation G.722 1988, pp. 1-76.

* cited by examiner

*Primary Examiner*—Susan McFadden
(74) *Attorney, Agent, or Firm*—Dickstein Shapiro LLP

(57) ABSTRACT

A speech decoding device is provided is capable of reducing degradation of speech quality caused by concealment processing performed when a loss of a packet has occurred, e.g., in speech packet communications using a VoIP (Voice over Internet Protocol) or the like. A decoding circuit decodes speech from a packet received through an input terminal and stores an internal signal in an updating buffer circuit, the internal signal produced in the decoding process and to be used in a decoding process for a subsequent packet to be subsequently received. The decoding circuit produces, based on the internal signal stored in the updating buffer circuit, concealed speech corresponding to a packet having not been received, and outputs the produced concealed speech. The internal signal is updated using the concealed speech.

21 Claims, 7 Drawing Sheets

REDUCTION OF SPEECH QUALITY DEGRADATION CAUSED BY PACKET LOSS

BACKGROUND OF THE INVENTION

1. Field of the Invention

The present invention relates to a speech decoding device and a speech decoding method, and more particularly to the speech decoding device and the method for decoding speech being capable of reducing degradation of speech quality caused by concealment processing to be performed when a loss of a packet has occurred, in speech packet communications using a VoIP (Voice over Internet Protocol) or a like.

The present application claims priority of Japanese Patent Application No. 2002-117187 filed on Apr. 19, 2002, which is hereby incorporated by reference.

2. Description of the Related Art

In packet-type speech communications such as a VoIP (Voice over Internet Protocol) system or a like, a transmitter combines one piece of speech frame data or a plurality of pieces of speech frame data obtained by encoding speech in a block unit of 10 msec or a like into one packet and, after having added information such as a produced time or a like to the packet, transmits it through a transmission path including the Internet or a like.

In the transmission path, a transmitted packet reaches a receiver through a plurality of repeaters such as a router, gateway, or a like. Since a packet is stored in a queue while passing through the repeater, there are some cases in which, if the repeater is put in a busy state, the packet is re-transmitted after much time has elapsed since its receipt or the packet is discarded due to no processing by the repeater in time. The receiver judges whether or not an order or a time given to a time stamp added to received packets is in compliance with predetermined rules. If it is not in compliance with the predetermined rules, the packet is regarded as lost. By using a concealment process to be performed on a portion corresponding to a lost packet, speech corresponding to the lost packet is decoded.

In the above concealment process, though its process varies depending on a method of encoding speech to be applied, based on information contained in packets having received before or after the lost packet, speech corresponding to the lost packet is produced. When a packet having been transmitted after the lost packet is used for the concealment process, a delay in decoding occurs because of receiving process of the packet.

A concealment process according to a CELP (Code Excited Linear Prediction) method being employed in various types of portable cellular phones is described, for example, in "Performance of the Proposed ITU-T 8 kb/s Speech Coding Standard for a Rayleigh Fading Channel" (IEEE Proc. Speech Coding Workshop, pp. 11-12, 1995) (Reference No. 1). A concealment process according to an ADPCM (Adaptive Differential Pulse Code Modulation) method being employed in a PHS (Personal Handy-Phone System) is described, for example, in "Improved ADPCM Voice Signal Transmission Employing Click-Noise Detection Scheme for TDMA-TDD Personal Communication System" (IEEE Trans. On Vehicular Technology, Vol. 46, No. 1, 1997) (Reference No. 2). Moreover, a same concealment process as used in the above ADPCM method can be applied to a band-splitting-type ADPCM method in which speech in a wide band of up to 7 kHz is encoded.

Examples of configurations of a conventional speech decoding device in which a packet loss concealment process is performed are explained by referring to FIGS. 9, 10, 11, and 12. FIG. 9 is a schematic block diagram showing an entire configuration of the conventional speech decoding device. FIGS. 10, 11, and 12 are schematic block diagrams illustrating speech decoding circuits employed in the conventional speech decoding device. That is, FIG. 10 is a block diagram showing an all-band-type decoding circuit to decode speech in all bands by using the CELP method and FIG. 11 is a block diagram showing an all-band-type decoding circuit to decode speech in all bands by using the ADPCM method. FIG. 12 is a block diagram showing a band-splitting-type decoding circuit to produce all band signals by performing an addition on signals obtained by splitting a band to decode speech.

Operations of the conventional speech decoding device are described by referring to FIG. 9. An input terminal 15 receives a packet and passes it to a decoding circuit 30. The input terminal 15 receives loss information indicating whether or not there is a loss of a packet and passes the information to the decoding circuit 30. The decoding circuit 30 decodes speech from packets fed from the input terminal 15 according to the loss information fed from an input terminal 10. Moreover, when speech is decoded from each of packets, an internal signal contained in a previous packet fed from a buffer circuit 35 is used. Then, after the decoding, the internal signal contained in the previous packet to be used in decoding a subsequent packet is passed to the buffer circuit 35. The internal signal to be used varies depending on a speech encoding method. Concrete examples of the decoding circuit 30 will be explained later by referring to FIGS. 10 and 11. Finally, decoded speech is passed to an output terminal 45. The buffer circuit 35 stores the internal signal fed from the decoding circuit 30 and passes the internal signals that had been stored at a time of speech decoding from a subsequent packet to the decoding circuit 30. The output terminal 45 outputs the decoded speech fed from the decoding circuit 30.

FIG. 10 is a block diagram showing an example of a conventional decoding circuit employed in a decoding device using the CELP method, in which the decoding circuit 30 shown in FIG. 9 is provided as a decoding circuit 203 in FIG. 10. The CELP method is described in "Code—Excited Linear Prediction: High Quality Speech at Very Low Bit Rates (IEEE Proc. ICASSP-85, pp. 937-940, 1985) (Reference No. 3). In the encoding device operated according to the CELP method, input speech is split into a linear prediction (LP) coefficient portion showing a spectrum enveloping characteristic obtained by a linear prediction (LP) analysis and an exciting signal used to drive an LP synthetic filter made up of the above LP coefficient portion to perform encoding. The LP analysis and encoding of the LP coefficient portion are performed for every frame having a predetermined length. Encoding of the exciting signal is performed for every sub-frame having a predetermined length obtained by further dividing the frame. Here, the exciting signal is made up of a pitch component representing a pitch period, a residual component other than the pitch component and a gain of each of the these components. The pitch component representing a pitch period of an input signal is expressed by an adaptive code vector stored in a code book called an "adaptive code book" holding exciting signals received in the past. The above residual component is expressed by a signal designed in advance called a "speech source code vector". As this signal, a multi-pulse signal made up of a plurality of pulses, a random number signal, or a like are used. Information about a speech source code vector is stored in a speech source code book. In the CELP-type decoding device, by inputting an exciting signal calculated from the decoded pitch period component and the residual signal into a synthetic filter made up of the decoded LP coefficient portion to calculate decoded speech.

Next, operations of the decoding circuit 203 (CELP-type) are described by referring to FIG. 10. In this specification, to simplify descriptions, a case where one frame is contained in one packet is described, however, even if a plurality of frames is contained in one packet, decoding is made possible by repeating operations in a same manner as described below. An input terminal 50 receives a packet and passes it to a speech source analyzing circuit 65, a pitch predicting circuit 68, and a synthetic filter circuit 88. An input terminal 55 receives loss information and passes it to the synthetic filter circuit 88, the speech source analyzing circuit 65, and the pitch predicting circuit 68. The speech source analyzing circuit 65 decodes a speech source code vector and its gain by using information indicated by a packet fed from the input terminal 50 and passes a speech source signal obtained by adding up the speech source code vector and its gain to an adder 75. However, if the loss information fed from the input terminal 55 indicates occurrence of loss of a packet, the speech source analyzing circuit 65 produces a pseudo speech source signal such as a random number or a like and passes it to the adder 75. The pitch predicting circuit 68 decodes an adaptive code vector and its gain by using information indicated by the packet fed from the input terminal 50 and passes a pitch period signal obtained by adding up the adaptive code vector and its gain to the adder 75. The adaptive code vector is obtained by allocating the adaptive code vector being stored as an internal signal from the buffer circuit 35 being placed outside and being connected through an input/output terminal 80. If the loss information fed from the input terminal 55 indicates occurrence of loss of a packet, a signal made up of, for example, "zero" is passed to the adder 75 as a pitch period signal. The adder 75 feeds an exciting signal obtained by adding up a speech source signal fed from the speech source analyzing circuit 65 and a pitch period signal fed from the pitch predicting circuit 68 to the synthetic filter circuit 88 and, at a same time, passes it as an internal signal through the input/output terminal 80 to the buffer circuit 35 (FIG. 9) being placed outside. The synthetic filter circuit 88 decodes an LP coefficient portion using information about a packet fed from the input terminal 50. Then, the synthetic filter circuit 88 constructs a synthetic filter by using the decoded LP coefficient and decodes speech by driving this filter using an exciting signal fed from the adder 75 and passes it to an output terminal 90. Providing that the LP coefficient is a(i), i=1, . . . , p, decoded speech x(t) can be calculated from an exciting signal e(t) by a following equation:

$$x(t) = e(t) + \sum_{i=1}^{p} a(i) \times (t - i) \quad \text{Equation (1)}$$

To solve the equation (1), decoded speech x (t−i), i=1, i=1, . . . , p received in the past is stored as an internal signal through the input/output terminal 80 in the buffer circuit 35 placed outside and is read into the decoding circuit 203 through the input/output terminal 80 when necessary. Here, "p" is an order of the LP coefficient. If the loss information fed from the input terminal 55 indicates occurrence of loss of a packet, the LP coefficient portion decoded from, for example, a previous packet is again used. The input/output terminal 80 outputs an exciting signal fed from the adder 75 as an internal signal to the buffer circuit 35 placed outside. Also, the input/output terminal 80 passes an adaptive code vector fed from the buffer circuit 35 placed outside in accordance with a pitch period fed from the pitch predicting circuit 68 as an internal signal to the pitch predicting circuit 68. Moreover, the input/output terminal 80 outputs decoded speech received in the past and fed from the synthetic filter circuit 88 as an internal signal to the buffer circuit and receives the decoded speech at a time when a subsequent packet is decoded and passes it to the synthetic filter circuit 88. The output terminal 90 outputs decoded speech fed from the synthetic filter circuit 88. In the CELP method, by performing filtering used to accentuate a spectral peak, which is called "post-filtering", on decoded speech output from the output terminal 90, acoustic quality of decoded speech can be improved.

FIG. 11 is a block diagram showing an example of a decoding circuit employed in a decoding device using the CELP method, in which the decoding circuit 30 shown in FIG. 9 is provided as a decoding circuit 204 in FIG. 11. The ADPCM method is described in "Overview of the ADPCM Coding Algorithm" (IEEE Proc. Of GLOBECOM' 84, pp. 774-777, 1984) (Reference No. 4). In the ADPCM-type encoding device, a predicting signal is subtracted from input speech for every sample and a resulting differential signal is encoded by a non-linear adaptive quantizer. Next, by using an output code obtained by the encoding, adaptation and adaptive reverse quantization processes are performed on a scale factor for quantizing. Reproduced speech is obtained by adding a predicting signal to the quantized differential signal obtained by the adaptive reverse quantization. An adaptive predicting device, by using these quantizied differential signal and reproduced speech, calculates a predicting signal. A decoding device performs a decoding process by calculating a predicting signal by same operations as performed in the encoding device. More particularly, the decoding device, by using a received quantized code, performs adaptation and adaptive reverse quantization of a scale factor for quantizing. Next, the adaptive predicting device, by using these quantized differential signal and reproduced speech, calculates a predicting signal of input speech. Finally, reproduced speech is obtained by adding a predicting signal to the quantized differential signal obtained by the adaptive reverse quantization.

Next, operations of the decoding circuit 204 (ADPCM-type) are described by referring to FIG. 11. When the ADPCM method in which an output code is obtained for every input speech sample is applied to packet communications, quantized codes are combined, for example, every 10 msec and transmitted as one packet. The input terminal 50 receives a packet and passes it to a reverse quantizing circuit 95 and a scale adaptive circuit 110. The input terminal 55 receives loss information and passes it to the reverse quantizing circuit 95, the scale adaptive circuit 110, a speed controlling circuit 115, and an adaptive predicting circuit 105. The reverse quantizing circuit 95 decodes a differential signal dp(k) by using a scale coefficient fed from the scale adaptive circuit 110 and by reverse-quantizing a code contained in a packet fed from the input terminal 50 and passes it to an adder 100 and the adaptive predicting circuit 105. If the loss information fed from the input terminal 55 indicates occurrence of loss of a packet, a signal made up of "zero" is output. The scale adaptive circuit 110 calculates a scale coefficient by using information I(k) contained in a packet fed from the input terminal 50 and a speed controlling coefficient al(k) fed from the speed controlling circuit 115 and passes a result from the calculation to the reverse quantizing circuit 95 and the speed controlling circuit 115. A scale controlling factor y(k) at a time "k" is obtained using a speed controlling coefficient al(k), a high-speed scale coefficient yu(k−1) received in the past, and a low-speed scale coefficient yl(k−1) by a following equation:

$$y(k)=al(k)yu(k-1)+(1-al(k))yl(k-1) \quad \text{Equation (2)}$$

Here, a high-speed scale coefficient yu(k) and a low-speed scale coefficient yl(k) at a time "k" are updated, based on the scale controlling coefficient y(k) at the time "k" when the above scale coefficients were calculated, by following equations:

$$yu(k)=(1-2^{-5})y(k)+2^{-5}W[I(k)] \quad \text{Equation (3)}$$

$$yl(k)=(1-2^{-6})yl(k-1)+2^{-6}yu(k) \quad \text{Equation (4)}$$

where W[X] is a function using "X" as an argument, and reference is made to a predetermined table. Moreover, the scale adaptive circuit 110 outputs a high-speed scale coefficient yu(k) and a low-speed scale coefficient yl(k) both being obtained by solving the equations (3) and (4), as an internal signal from the input/output terminal 80, stores them in the buffer circuit 35 being placed outside, and then again receives them as a previous sample's coefficients yu(k−1) and yl(k−1) from the input/output terminal 80 for use when solving the equations (3) and (4) next. When the loss information fed from the input terminal 55 indicates occurrence of loss of a packet, while a concealment process is being performed on the packet, equations (3) and (4) are not updated. The speed controlling circuit 115, by using following equations, calculates a speed controlling coefficient al(k) from a scale coefficient y(k) fed from the scale adaptive circuit 110.

$$al(k)=\begin{cases}1, & ap(k-1)>1\\ ap(k-1), & ap(k-1)\le 1\end{cases} \quad \text{Equation (5)}$$

where $$ap(k)=\begin{cases}[1-2^{-4}]ap(k-1)+2^{-3}, & |dms(k)-dml(k)|>2^{-3}dml(k)\ or\ y(k)<3\\ [1-2^{-4}]ap(k-1), & \text{other}\end{cases} \quad \text{Equation (6)}$$

$$dms(k)=[1-2^{-5}]dms(k-1)+2^{-5}F[I(k)] \quad \text{Equation (7)}$$

$$dml(k)=[1-2^{-7}]dml(k-1)+2^{-7}F[I(k)] \quad \text{Equation (8)}$$

where F[X] is a function using "X" as an argument, and reference is made to a predetermined table. Moreover, the speed controlling circuit 115 outputs the coefficients ap(k), dms (k), and dml(k) all being obtained by solving the equations (6) to (8) as internal signals from the input/output terminal 80, stores them in the buffer circuit 35 being placed outside, and then again receives them as a previous sample's coefficients ap(k−1), dms(k−1) and dml(k−1) from the input/output terminal 80 for use when solving the equations (6) to (8) next. When the loss information fed from the input terminal 55 indicates occurrence of loss of a packet, while a concealment process is being performed on the packet, equations (6) to (8) are not updated. The adaptive predicting circuit 105, by using a differential signal dp(k) fed from the reverse quantizing circuit 95, a predicting signal se(k−1), i=1, . . . , 2 received in the past fed through the input/output terminal 80 from the buffer circuit 35 placed outside, and a differential signal dp(k−1), i=1, . . . , 6 received in the past, calculates a predicting signal se(k) at a time "k" by following equations and passes a result from the calculation to the adder 100.

$$se(k)=\sum_{i=1}^{2}a(i,k-1)sr(k-i)+sez(k) \quad \text{Equation (9)}$$

where, $$sr(k-i)=se(k-i)+dq(k-i) \quad \text{Equation (10)}$$

$$sez(k)=\sum_{i=1}^{6}b(i,k-1)dq(k-i) \quad \text{Equation (11)}$$

Moreover, "a(i, k−1)" and "b(i, k−1)" are predicting coefficients and are updated based on dp(k) by following equations so as to be a(i, k) and b(i, k) respectively.

$$b(i,k)=[1-2^{-8}]b(i,k-1)+2^{-8}sgn[dq(k)]sgn[dq(k-i)],\ i=1,\ldots,6 \quad \text{Equation (12)}$$

$$a(1,k)=[1-2^{-8}]a(1,k-1)+3\cdot 2^{-8}sgn[p(k)]sgn[p(k-1)] \quad \text{Equation (13)}$$

$$a(2,k)=[1-2^{-7}]a(2,k-1)+2^{-7}sgn[p(k)]sgn[p(k-2)]-f[a(1,k-1)]sgn[p(k)]sgn[p(k-1)] \quad \text{Equation (14)}$$

where, $$p(k)=dq(k)+sez(k) \quad \text{Equation (15)}$$

$$f(x)=\begin{cases}4x, & |x|\le 2^{-1}\\ 2sgn(x), & |x|>2^{-1}\end{cases} \quad \text{Equation (16)}$$

however;

$$|a(2,k)|\leqq 0.75 \quad \text{Equation (17)}$$

$$|a(1,k)|\leqq 1-2^{-4}-a(2,k) \quad \text{Equation (18)}$$

where sgn [X] represents a code of "x". The adaptive predicting circuit 105 stores dq(k) fed from the reverse quantizing circuit 95, se(k) calculated by the equations (9) to (10) and a(i, k) and b(i, k) calculated by the equations (12) to (14) through the input/output terminal 80 in the buffer circuit 35 being placed outside and uses them as a previous sample's coefficients dp(k−1), se(k−1), a(i, k−1), and b(i, k−1) when solving the equations (9) to (14) next. When the loss information fed from the input terminal 55 indicates occurrence of loss of a packet, while a concealment process is being performed on the packet, equations (12) and (14) are not updated. The adder 100 passes decoded speech obtained by adding up a reverse quantized signal fed from the reverse quantizing circuit 95 and a predicting signal fed from the adaptive predicting circuit 105 to the adaptive predicting circuit 105 and the output terminal 90. The output terminal 90 outputs the decoded speech fed from the adder 100. Moreover, in the concealment processing performed according to the ADPCM method, instead of a code I(K) lost due to loss of a packet, a code which makes a reverse quantized signal become zero or a small value (for example, an absolute value is less than 7) may be used. This causes decoded speech to become a small value.

FIG. 12 is a schematic block diagram showing an example of configurations of the decoding circuit 30 in a band-splitting speech decoding device. When a signal in each band is encoded, various methods including the CELP, the ADPCM method, or a like can be applied. A typical method is an ITU-T G.722 method, which is described in, for example, "7 kHz Audio Coding within 64 kbit/s" (ITU-T Recommendation G. 722, 1988) (Reference No. 5).

Next, operations of the band-splitting type speech decoding circuit are described by referring to FIG. 12. An input terminal 121 receives a packet and passes it to a low-band decoding circuit 66 and a high-band decoding circuit 67. An input terminal 56 receives loss information and passes it to the low-band decoding circuit 66 and the high-band decoding circuit 67. The CELP method shown in FIG. 10 and the ADPCM method shown in FIG. 11 can be applied to the low-band decoding circuit 66 and/or the high-band decoding circuit 67. The low-band decoding circuit 66 decodes speech having signals in a low frequency band (for example, less than 4 kHz) according to the loss information fed from the input terminal 56 by using a packet fed from the input terminal 121 and passes the decoded speech to a band adder 43. The low-band decoding circuit 66 receives and transmits an internal signal through the input/output terminal 80 from and to the buffer circuit 35 being placed outside. The high-band decoding circuit 67 decodes speech having a band signal corresponding to a high frequency band (for example, 4 kHz or more) according to the loss information fed from the input terminal 56 by using a packet fed from the input terminal 121 and passes the decoded speech to the band adder 43. Moreover, the high-band decoding circuit 67 receives and transmits an internal signal through the input/output terminal 80 from and to the buffer circuit 35 placed outside. The band adder 43 performs up-sampling on the high-band speech as a component of a high frequency band fed from the high-band decoding circuit 67 and adds this up-sampled speech to a signal obtained by performing up-sampling on the low-band speech as a component of a low frequency band fed from the low-band decoding circuit 66 to decode wide-band speech and passes the decoded speech to an output terminal 51. The output terminal 51 outputs the wide-band decoded speech fed from the band adder 43.

Thus, in the conventional speech decoding device, when loss of a packet occurs, speech corresponding to a portion of speech that has been lost is decoded by using concealment processing. However, the conventional speech decoding device has a problem in that, in the prediction encoding method in which encoding and decoding are performed by using internal signals received in the past, an abnormal large amplitude occurs at a time of decoding packets following the concealment processing and therefore degradation of speech quality occurs. This is because internal signals having not been updated or having been initialized are used in decoding processes, which causes a great difference in internal signals that should be matched between in encoding and decoding processes.

SUMMARY OF THE INVENTION

In view of the above, it is an object of the present invention to provide a speech decoding device and a method for decoding speech being capable of reducing degradation of speech quality caused by concealment processing to be performed when a loss of a packet has occurred.

According to a first aspect of the present invention, there is provided a speech decoding device including:

a first circuit to receive a packet and decode speech from the received packet;

a second circuit to store an internal signal produced in the decoding process by the first circuit and to be used by the first circuit in a decoding process for a subsequent packet to be subsequently received;

a third circuit to produce concealed speech corresponding to a packet having not been received using a prior received packet; and a fourth circuit to update the internal signal using the concealed speech.

In the foregoing first aspect, a preferable mode is one wherein a code excited linear prediction method is employed and wherein the internal signal contains exciting signals stored as an adaptive code book and prior decoded speech which is to be used in processing by a linear predicting synthetic filter.

Another preferable mode is one wherein an adaptive differential pulse code modulation method is employed and wherein the internal signal contains a prior output signal which is to be used in predictive processing and coefficients used to control an amplitude or a speed of changing.

According to a second aspect of the present invention, there is provided a speech decoding device including:

a decoding circuit to sequentially receive packets containing at least one piece of speech frame data encoded in a block unit for every specified interval in a speech encoding device on a side of a sender, to decode speech frame data in order of packets specified by a time stamp being attached to a received packet, to store an internal signal produced in the decoding process and to be used in a subsequent decoding process for subsequent speech frame data in a buffer, and to produce and output concealed speech corresponding to a packet having not been received, based on the internal signal being stored in the buffer; and an updating circuit to update the internal signal being stored in the buffer using an internal signal obtained by encoding the concealed speech produced in the decoding circuit by a same method employed in the speech encoding device.

In the foregoing second aspect, a preferable mode is one wherein a code excited linear prediction method is employed and wherein the internal signal contains exciting signals stored as an adaptive code book and prior decoded speech which is to be used in processing by a linear predicting synthetic filter.

Another preferable mode is one wherein an adaptive differential pulse code modulation method is employed and wherein the internal signal contains a prior output signal which is to be used in predictive processing and coefficients used to control an amplitude or a speed of changing.

According to a third aspect of the present invention, there is provided a speech decoding device including:

a first circuit to receive a packet and decode speech from the received packet;

a second circuit to store an internal signal produced in the decoding process by the first circuit and to be used by the first circuit in a decoding process for a subsequent packet to be subsequently received;

a third circuit to produce concealed speech corresponding to a packet having not been received by using a prior received packet;

a fourth circuit to measure a length of time during which no receiving of a packet occurs continuously; and a fifth circuit to change the internal signal, when the length of time is longer than a predetermined length of time, to decode speech from a packet received thereafter.

In the foregoing third aspect, a preferable mode is one wherein packets received continuously only within a length of time being shorter than the predetermined length of time are regarded as having not been received in a process of measuring the length of time.

Another preferable mode is one wherein a code excited linear prediction method is employed and wherein the internal signal contains exciting signals stored as an adaptive code book and prior decoded speech which is to be used in processing by a linear predicting synthetic filter and wherein, in a process of changing the internal signal, a prior signal to be used in predictive processing is made smaller to flatten its spectrum characteristics.

Still another preferable mode is one wherein an adaptive differential pulse Code modulation method is employed and wherein the internal signal contains a prior output signal which is to be used in predictive processing and coefficients used to control an amplitude or a speed of changing and wherein, in a process of changing the internal signal, a prior signal to be used in predictive processing is made smaller to reduce a prior influence exerted on an amplitude or a change of speed.

According to a fourth aspect of the present invention, there is provided a speech decoding device including:

a decoding circuit to sequentially receive packets containing at least one piece of speech frame data encoded in a block unit for every specified interval in a speech encoding device on a side of a sender, to decode speech frame data in order of packets specified by a time stamp attached to a received packet, to store an internal signal produced in the decoding process and to be used in a subsequent decoding process for subsequent speech frame data in a buffer, and to produce and output concealed speech corresponding to a packet having not been received, based on the internal signal being stored in the buffer;

a loss measuring circuit to measure a length of time during which no receiving of a packet occurs continuously; and wherein the decoding circuit is so configured, when the length of time measured by the loss measuring circuit is longer than a predetermined length of time, as to change the internal signal being stored in the buffer for use, to decode speech from a packet received thereafter.

In the foregoing fourth aspect, a preferable mode is one wherein packets received continuously only within a length of time being shorter than the predetermined length of time are regarded as having not been received in a process of measuring the length of time.

Another preferable mode is one wherein a code excited linear prediction method is employed and wherein the internal signal contains exciting signals stored as an adaptive code book and prior decoded speech which is to be used in processing by a linear predicting synthetic filter and wherein, in a process of changing the internal signal, a prior signal to be used in predictive processing is made smaller to flatten its spectrum characteristics.

Still another preferable mode is one wherein an adaptive differential pulse Code modulation method is employed and wherein the internal signal contains a prior output signal which is to be used in predictive processing and coefficients used to control an amplitude or a speed of changing and wherein, in a process of changing the internal signal, a prior signal to be used in predictive processing is made smaller to reduce a prior influence exerted on an amplitude or a change of speed.

According to a fifth aspect of the present invention, there is provided a method for decoding speech including:

a first step of receiving a packet and decoding speech from the received packet;

a second step of storing an internal signal produced by decoding in the first step and to be used in the first step for decoding of a subsequent packet to be subsequently received;

a third step of producing concealed speech corresponding to a packet having not been received using a prior received packet; and a fourth step of updating the internal signal by using the concealed speech.

In the foregoing fifth aspect, a preferable mode is one wherein a code excited linear prediction method is employed and wherein the internal signal contains exciting signals stored as an adaptive code book and prior decoded speech which is to be used in processing by a linear predicting synthetic filter.

Another preferable mode is one wherein an adaptive differential pulse code modulation method is employed and wherein the internal signal contains a prior output signal which is to be used in predictive processing and coefficients used to control an amplitude or a speed of changing.

According to a sixth aspect of the present invention, there is provided a method for decoding speech including:

a first step of receiving a packet and decoding speech from the received packet;

a second step of storing an internal signal produced by decoding in the first step and to be used in the first step for decoding of a subsequent packet to be subsequently received;

a third step of producing concealed speech corresponding to a packet having not been received using a prior received packet;

a fourth step of measuring a length of time during which no receiving of a packet occurs continuously; and a fifth step of changing the internal signal, when the length of time is longer than a predetermined length of time, to decode speech from a packet received thereafter.

In the foregoing sixth aspect, a preferable mode is one wherein, in the fourth step, packets received continuously only within a length of time being shorter than a predetermined length of time are regarded as having not been received in a process of measuring the length of time.

Another preferable mode is one wherein a code excited linear prediction method is employed and wherein the internal signal contains exciting signals stored as an adaptive code book and prior decoded speech which is to be used in processing by a linear predicting synthetic filter and wherein, in a process of changing the internal signal, a prior signal to be used in predictive processing is made smaller and a spectrum characteristic is made flattened.

Still another preferable mode is one wherein an adaptive differential pulse Code modulation method is employed and wherein the internal signal contains a prior output signal which is to be used in predictive processing and coefficients used to control an amplitude or a speed of changing and wherein, in a process of changing the internal signal, a prior signal to be used in predictive processing is made smaller to reduce a prior influence exerted on an amplitude or a speed of changing.

With the above configurations, by employing an approximation method in which decoded speech produced by concealment processing does not differ greatly from encoded input speech and by encoding the decoded speech produced by concealment processing in a decoding device, internal signals required in the decoding device are updated. The decoded internal signals are used in decoding of a subsequent packet. This enables reduction of mismatching that occurs due to concealment processing between internal signals in the encoding device and internal signals in the decoding device. As a result, quality of decoded speech can be improved. Moreover, if loss of a packet occurs during a long length of time, internal signals in the decoding device become different greatly from internal signals in the coding device. To reduce this difference, in the case of occurrence of loss of a packet during a long length of time, limitation is imposed on internal signals so that first decoded speech on which decoding from a packet is performed does not take on a large value. This also enables reduction of mismatching that occurs due to concealment processing between internal signals in the encoding device and internal signals in the decoding device. As a result, quality of decoded speech can be improved. That is, occurrence of an abnormally large amplitude, that was found in the conventional decoding device, caused by decoding of a packet following concealment processing performed due to loss of a packet can be reduced and degradation in speech quality can be prevented. This is because differences in internal signals occurring between encoding processing and decoding processing can be reduced by updating internal signals using concealed speech by processing being approximate to encoding processing and imposing a limitation on internal signals so that first decoded speech on which decoding from a packet is performed does not take on a large value.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
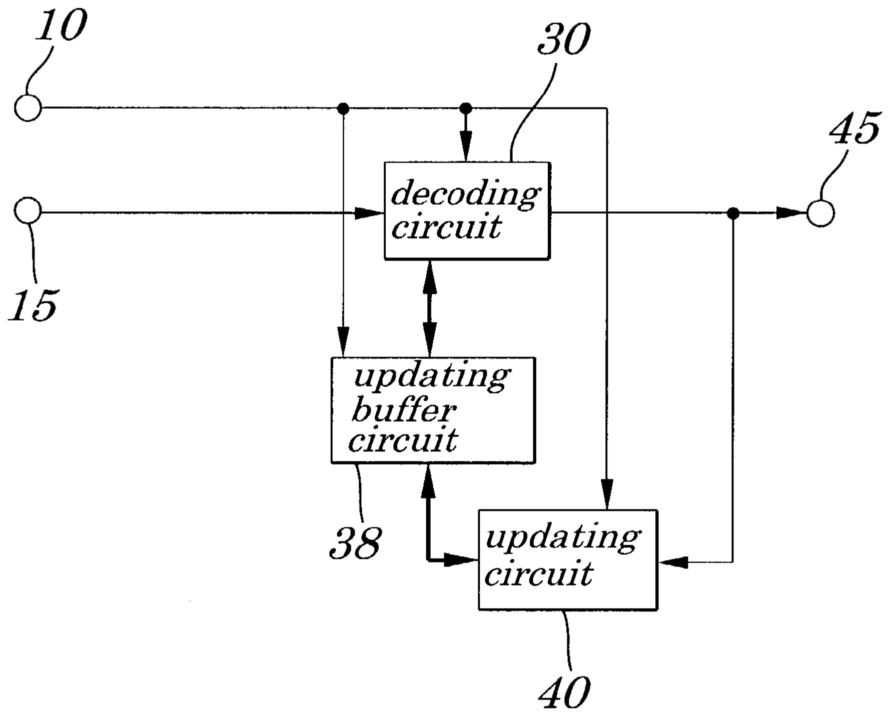
FIG. 1 is a schematic block diagram showing an example of configurations of a speech decoding device according to a first embodiment of the present invention.
Figure 2:
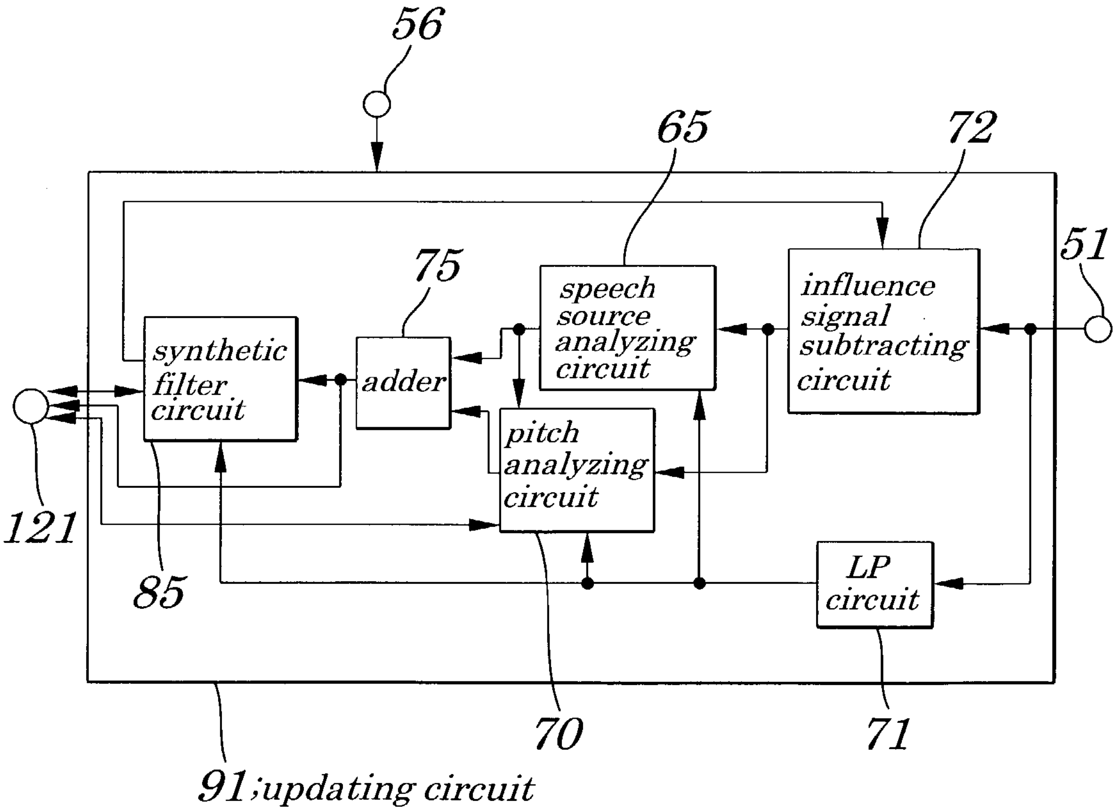
FIG. 2 is a schematic block diagram showing an example of configurations of an updating circuit employed in the speech decoding device of the first embodiment to which a CELP method is applied.
Figure 3:
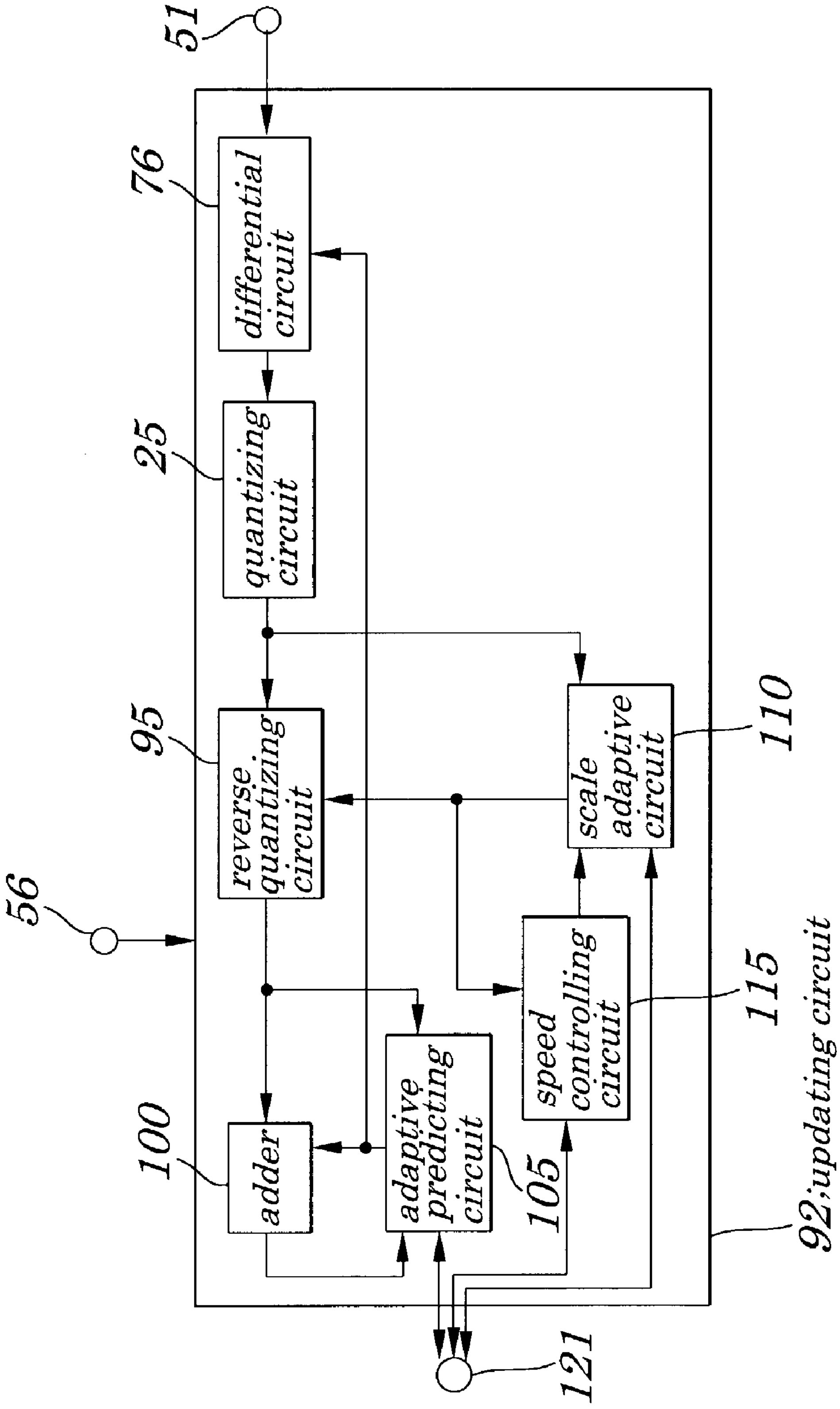
FIG. 3 is a schematic block diagram showing an example of configurations of an updating circuit employed in the speech decoding device of the first embodiment to which an ADPCM method is applied.
Figure 4:
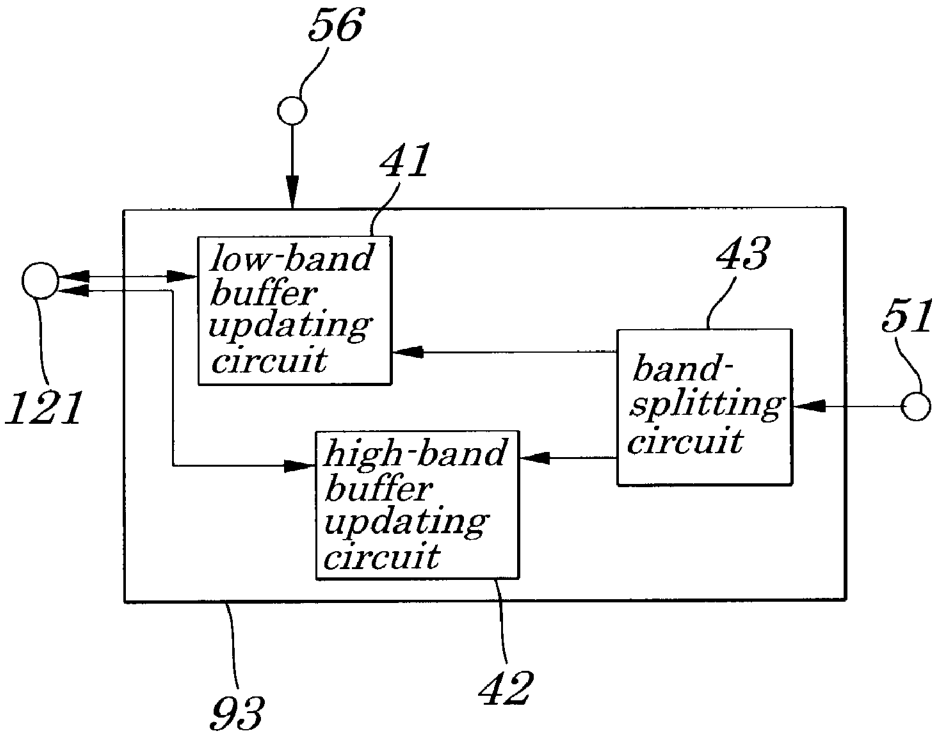
FIG. 4 is a schematic block diagram showing an example of configurations of an updating circuit employed in the speech decoding device of the first embodiment to which a band-splitting method is applied.

A speech decoding device of a first embodiment of the present invention is described by referring to FIG. 1 to FIG. 4. FIG. 1 is a schematic block diagram showing an example of configurations of the speech decoding device according to the first embodiment of the present invention. FIG. 2 is a schematic block diagram showing an example of configurations of an updating circuit 91 employed in the speech decoding device of the first embodiment to which a CELP method is applied. FIG. 3 is a schematic block diagram showing an example of configurations of an updating circuit 92 employed in the speech decoding device of the first embodiment to which an ADPCM method is applied. FIG. 4 is a schematic block diagram showing an example of configurations of an updating circuit 93 employed in the speech decoding device of the first embodiment to which a band-splitting method is applied in which signals in all bands are produced from signals decoded after splitting of a band.

Figure 9:
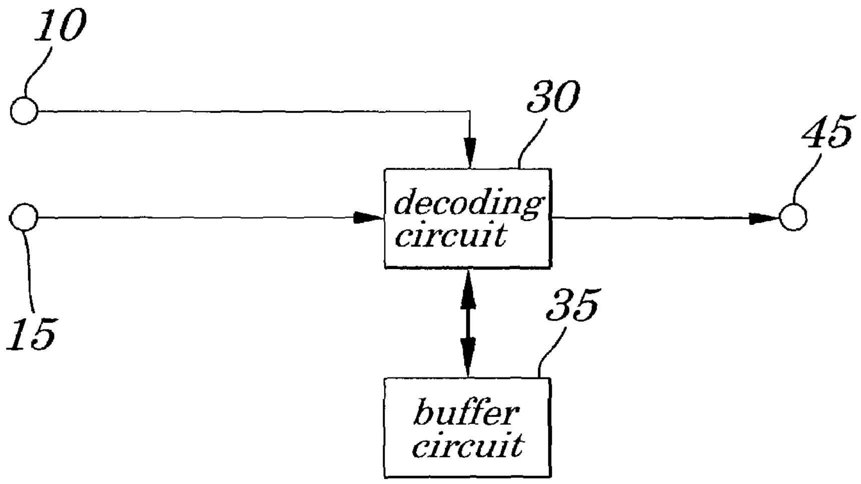
FIG.9 (PRIOR ART)
FIG. 9 is a schematic block diagram showing an example of configurations of a speech decoding device based on a conventional speech decoding method.

Configurations of the speech decoding device of the first embodiment shown in FIG. 1 differ from those of the conventional speech decoding device shown in FIG. 9 in that, instead of a buffer circuit 35, an updating buffer circuit 38 and an updating circuit 40 are newly provided. Only operations related to the updating buffer circuit 38 and the updating circuit 40 are explained accordingly. An input terminal 10 feeds loss information not only to a decoding circuit 30 but also to the updating circuit 40 and the updating buffer circuit 38. The decoding circuit 30 receives and transmits internal signals from and to the updating buffer circuit 38. Moreover, the decoding circuit 30 passes decoded speech to the updating circuit 40. The updating circuit 40, if the loss information fed from the input terminal 10 indicates occurrence of loss of a packet, by using the decoded speech fed from the decoding circuit 30, updates internal signals fed from the updating buffer circuit 38 and returns the updated internal signal to the updating buffer circuit 38. The updating buffer circuit 38, if the loss information fed from the input terminal 10 indicates occurrence of loss of a packet, receives the updated internal signals from the updating circuit 40 and replaces them with internal signals being stored to be used in processing in the decoding circuit 30. To simplify the processing, when packets are lost continuously, the above replacement may be performed not on each of lost packets but only on a last one of packets that are lost continuously.

Operations of the updating circuit 40 to which the CELP method is applied are described by referring to FIG. 2 in which the updating circuit 40 shown in FIG. 1 is shown as an updating circuit 91 in FIG. 2. In the updating circuit 91, same processing as the encoding according to the CELP method is performed. Details of the encoding processing according to the CELP method are described in, for example, Reference No. 3. (See Description of the Related Art.) An input terminal 51 receives decoded speech and feeds it to an influence signal subtracting circuit 72 and an LP (Linear Predicting) circuit 71. An input terminal 56 receives loss information and, only when the loss information indicates occurrence of loss of a packet, performs processing contained in the updating circuit 91. The influence signal subtracting circuit 72 subtracts influence signal, which was received in the past fed from a synthetic filter circuit 85, from decoded speech fed from the input terminal 51 and feeds subtracted decoded speech as a result of the substraction to a speech source analyzing circuit 65 and a pitch analyzing circuit 70. The LP circuit 71 performs an LP (Linear Prediction) analysis on decoded speech fed from the input terminal 51 and performs encoding and decoding of an LP (Linear Prediction) coefficient obtained from the above analysis. Moreover, the LP circuit 71 passes the quantized LP coefficient obtained from decoding to the speech source analyzing circuit 65, a pitch analyzing circuit 70, and a synthetic filter circuit 85. The speech source analyzing circuit 65, by using the subtracted decoded speech fed from the influence signal subtracting circuit 72 and a quantized LP coefficient fed from the LP circuit 71, encodes a speech source signal contained in the subtracted decoded speech. Moreover, the speech source analyzing circuit 65 passes the speech source signal to an adder 75 and the pitch analyzing circuit 70. The pitch analyzing circuit 70, by using the subtracted decoded speech fed from the influence signal subtracting circuit 72 and the quantized LP coefficient fed from the LP circuit 71, and an exciting signal obtained from the updating buffer circuit 38 being placed outside through an input/output terminal 121, extracts a pitch period from the subtracted decoded speech and calculates a corresponding pitch signal. The adder 75 produces an exciting signal by adding up a source signal fed from the speech source analyzing circuit 65 and a pitch period signal fed from the pitch analyzing circuit 70. Moreover, the adder 75 passes the exciting signal to the synthetic filter circuit 85 and, at a same time, through the input/output terminal 121 to the updating buffer circuit 38 placed outside as an internal signal. The synthetic filter circuit 85 makes up a synthetic filter using the quantized LP coefficient fed from the LP circuit 71 and calculates an influence signal by driving the synthetic filter using the exciting signal fed from the adder 75 and passes the influence signal to the influence signal subtracting circuit 72. Also, the synthetic filter circuit 85 receives and transmits the influence signal received in the past and to be used in filtering processing through the input/output terminal 121 from and to the updating buffer circuit 38 being placed outside. The input/output terminal 121 is used, in order to output an exciting signal from the adder 75, to receive and transmit an internal signal used by the synthetic filter circuit 85 and pitch analyzing circuit 70 to and from the updating buffer circuit 38 being placed outside.

Operations of the updating circuit 40 to which the ADPCM method is applied are described by referring to FIG. 3 in which the updating circuit 40 shown in FIG. 1 is shown as an updating circuit 92. In the updating circuit 92, same processing as the encoding according to the ADPCM method is performed. Details of the encoding processing according to the ADPCM method are described in, for example, Reference No. 4. (See Description of the Related Art.) The input terminal 51 receives decoded speech and passes it to a differential circuit 76. The differential circuit 76 subtracts a predicting signal fed from an adaptive predicting circuit 105 from the decoded speech fed from the input terminal 51 and passes the obtained differential signal to a quantizing circuit 25. The quantizing circuit 25 scalar-quantizes the differential signal fed from the differential circuit 76 and passes obtained quantized codes to a reverse quantizing circuit 95 and a scale adaptive circuit 110. The reverse quantizing circuit 95, by using a scale coefficient fed from the scale adaptive circuit 110, decodes the quantized differential signal from the quantized codes fed from the quantizing circuit 25 by using reverse quantizing processing and outputs them to an adder 100 and the adaptive predicting circuit 105. The scale adaptive circuit 110, by using the quantized codes fed from the quantizing circuit 25 and a speed controlling coefficient fed from a speed controlling circuit 115, calculates a scale coefficient and passes it to the reverse quantizing circuit 95 and the speed controlling circuit 115. A scale coefficient y(k) is calculated by the equations (2) to (4) described above using a speed controlling coefficient al(k), a high-speed scale coefficient yu(k), and a low-speed coefficient yl(k). Moreover, the scale adaptive circuit 110 outputs the high-speed scale coefficient yu(k) and low-speed coefficient yl(k) calculated by the equations (3) and (4) (Description of the Related Art) from the input/output terminal 121, then stores them in the updating buffer circuit 38 being placed outside and again receives them from the input/output terminal 121 as a previous sample's coefficients yu(k−1) and yl(k−1) for use when solving the equations (3) and (4) next. The speed controlling circuit 115, by using the equations (5) to (8) described above, calculates a speed controlling coefficient al(k) from the scale coefficient y(k) fed from the scale adaptive circuit 110. Also, the speed controlling circuit 115 outputs the coefficients ap(k), dms(k), and dml(k) calculated by the equations (6) to (8) (Description of the Related Art) from the input/output terminal 121, passes them to the updating buffer circuit 38 being placed outside, then again receives them, from the input/output terminal 121, as a previous sample's coefficients ap(k−1), dms(k−1), and dml(k−1) for use when solving the equations (6) to (8) next. The adaptive predicting circuit 105, by using the differential signal dq(k) fed from the reverse quantizing circuit 95, the predicting signal se(k-i), i=1, . . . , 2 received in the past and fed from the input/output terminal 121, and the differential signal dq(k−i), i=1, . . . , 6 received in the past, calculates a predicting signal at a time "k" by the equations (9) to (11) (See Description of the Related Art) described above and passes it to the adder 100. Here, the coefficients a(i, k−1) and b(i, k−1) are predicting coefficients and are updated to be coefficients a(i, k) and b(i, k) based on the differential signal dq(k) (refer to the equations (See Description of the Related Art) (12) to (14)). Also, the adaptive predicting circuit 105 feeds dq(k) fed from the reverse quantizing circuit 95, se(k) calculated by the equations (9) to (11), and a(i, k) and b(i, k) calculated by the equations (12) to (14) through the input and output terminal 121 to the updating buffer circuit 38 being placed outside and uses them as a previous sample's values dq(k−1), se(k−1), a(i, k−1), and b(i, k−1) when solving the equations (9) to (14) next. The adder 100 passes decoded speech obtained by adding up the reverse quantized signal fed from the reverse quantizing circuit 95 and the predicting signal fed from the adaptive predicting circuit 105 to the adaptive predicting circuit 105 and the output terminal 45.

Figure 12:
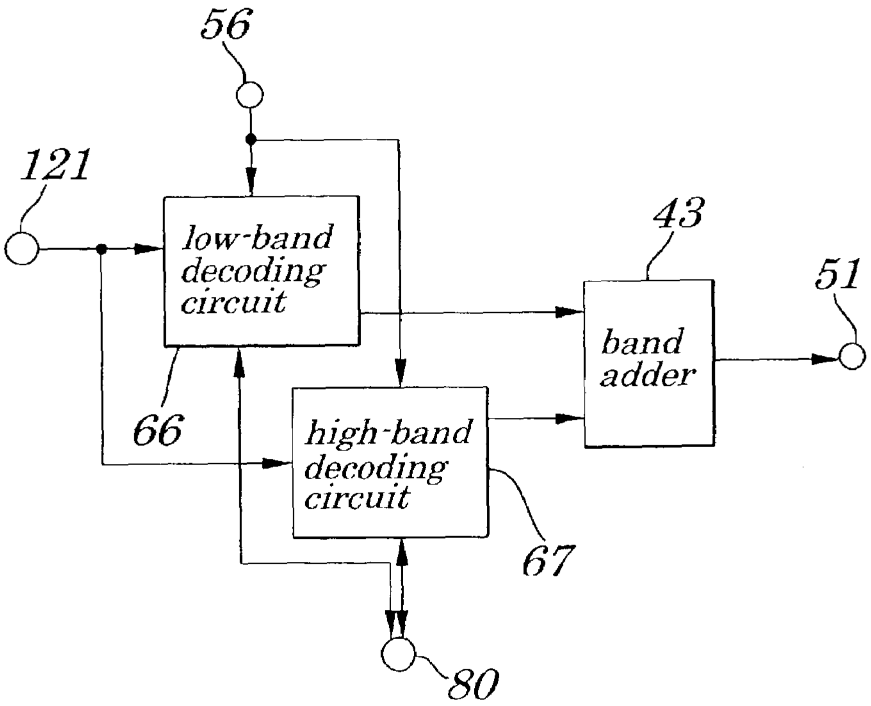
FIG. 12 (PRIOR ART)
FIG. 12 is a schematic block diagram showing an example of configurations of a speech decoding circuit employed in the conventional speech decoding device to which a band splitting method is applied.

Operations of the updating circuit to which the band-splitting method is applied are described by referring to FIG. 4 in which the updating circuit 40 shown in FIG. 1 is shown as an updating circuit 93. The updating circuit 93 performs same processing as a band-splitting encoding method designated by ITU-T G.722 or a like and details of the method are described in, for example, Reference No. 5. (See Description of the Related Art) The input terminal 51 receives the decoded speech and passes it to a band-splitting circuit 43. The input terminal 56 receives loss information and, only if the loss information indicates occurrence of loss of a packet, performs processing contained in the updating circuit 93. The band-splitting circuit 43 splits the decoded speech into a high-band signal having a high frequency band component and being down-sampled and into a low-band signal having a low frequency band component. Moreover, the band-splitting circuit 43 passes the high-band signal and the low-band signal, respectively, to a high-band buffer updating circuit 42 and to a low-band buffer updating circuit 41. As the high-band buffer updating circuit 42 and low-band buffer updating circuit 41, each of the updating circuits 91 and 92 shown in detail in FIG. 2 and FIG. 3 may be used. The low-band buffer updating circuit 41 encodes a low-band signal fed from the band-splitting circuit 43. At this time, the low-band buffer updating circuit 41 receives and transmits an internal signal through the input/output terminal 121 from and to the updating buffer circuit 38 being placed outside. The high-band buffer updating circuit 42 encodes a high-band signal fed from the band-splitting circuit 43. At this time, the high-band buffer updating circuit 42 receives and transmits an internal signal through the input/output terminal 121 from and to the updating buffer circuit 38 being placed outside. Moreover, when a band-splitting method is applied to a speech decoding device, that is, when a decoding circuit shown in FIG. 12 (Prior Art) is used as the decoding circuit 30 shown in FIG. 1 and the updating circuit 93 shown in FIG. 4 is used as the updating circuit 40 shown in FIG. 1, it is not necessary that decoded speech is fed from the decoding circuit 30 shown in FIG. 1 to the updating circuit 40 shown in FIG. 1 and a low-band decoded signal calculated by a low-band decoding circuit 66 shown in FIG. 12 (Prior Art) may be directly passed to the low-band buffer updating circuit 41 shown in FIG. 4 and a high-band decoded signal calculated by a high-band decoding circuit 67 shown in FIG. 12 may be directly passed to the high-band buffer updating circuit 42 shown in FIG. 4. By configuring above, the band-splitting circuit 43 shown in FIG. 4 can be removed and an amount of arithmetic operations can be reduced.

Second Embodiment

Figure 5:
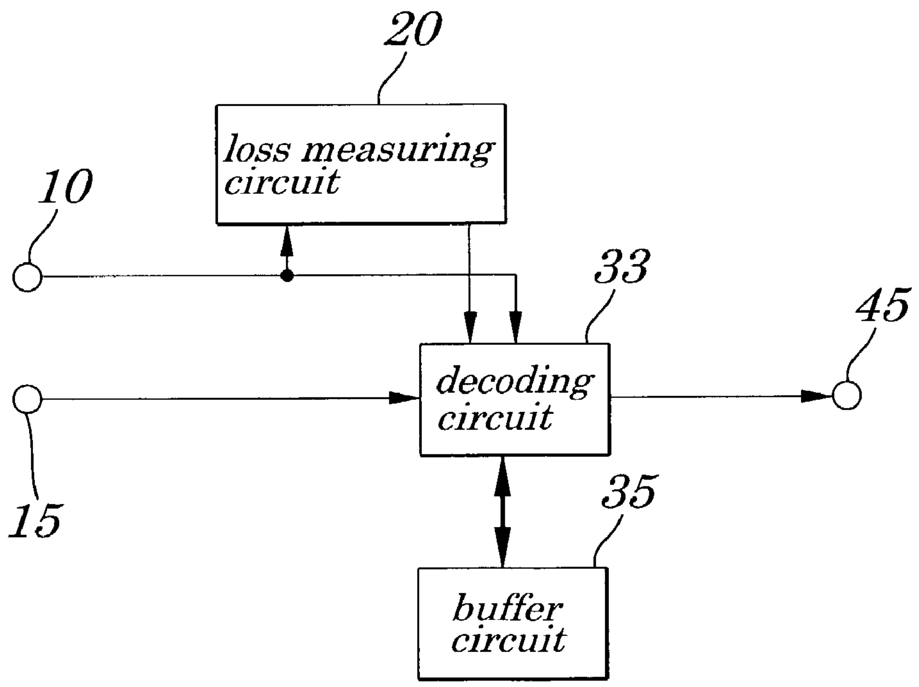
FIG. 5 is a schematic block diagram showing an example of configurations of a speech decoding device according to a second embodiment of the present invention.
Figure 6:
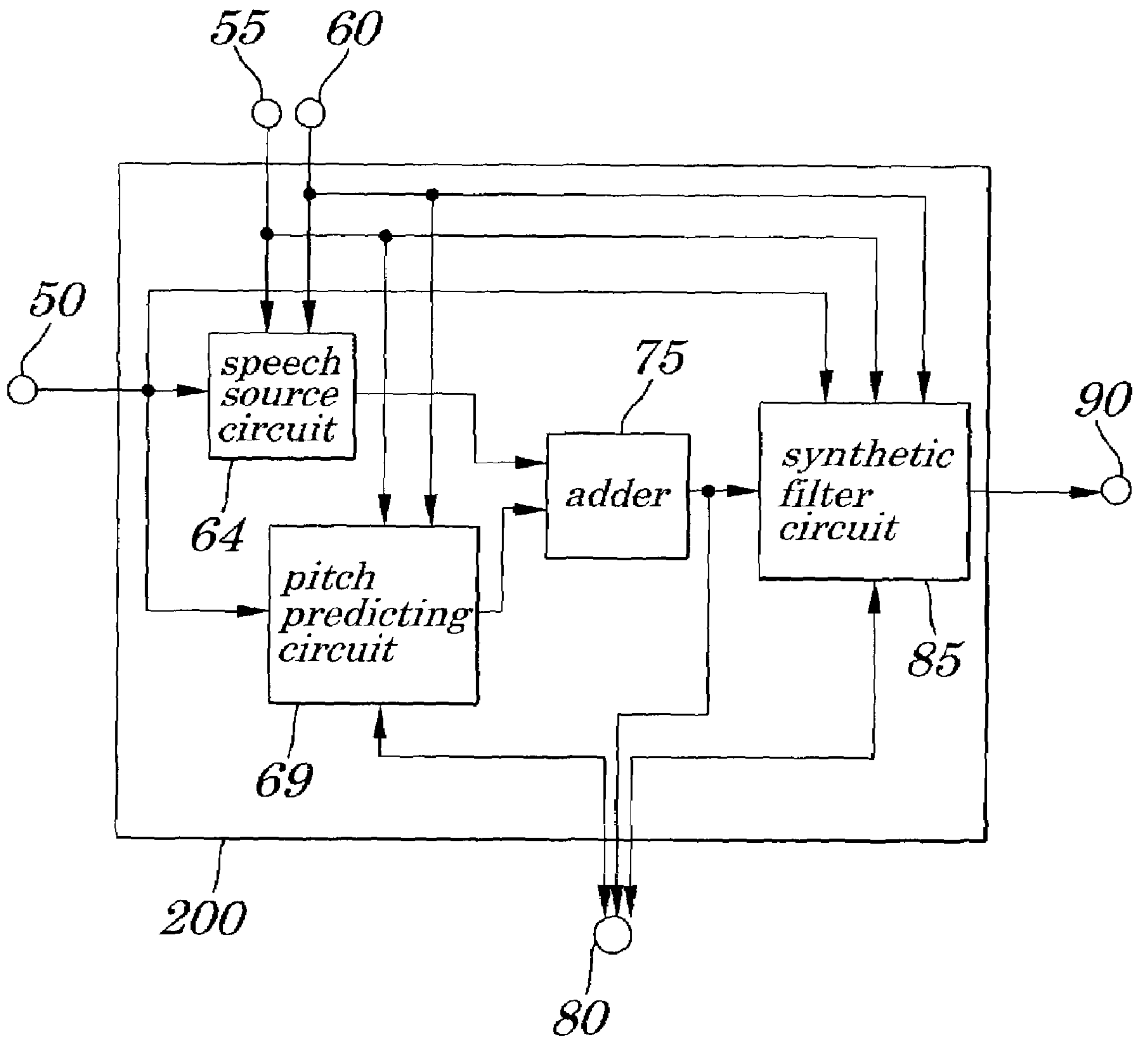
FIG. 6 is a diagram showing an example of configurations of a decoding circuit employed in the speech decoding device of the second embodiment to which a CELP method is applied.
Figure 7:
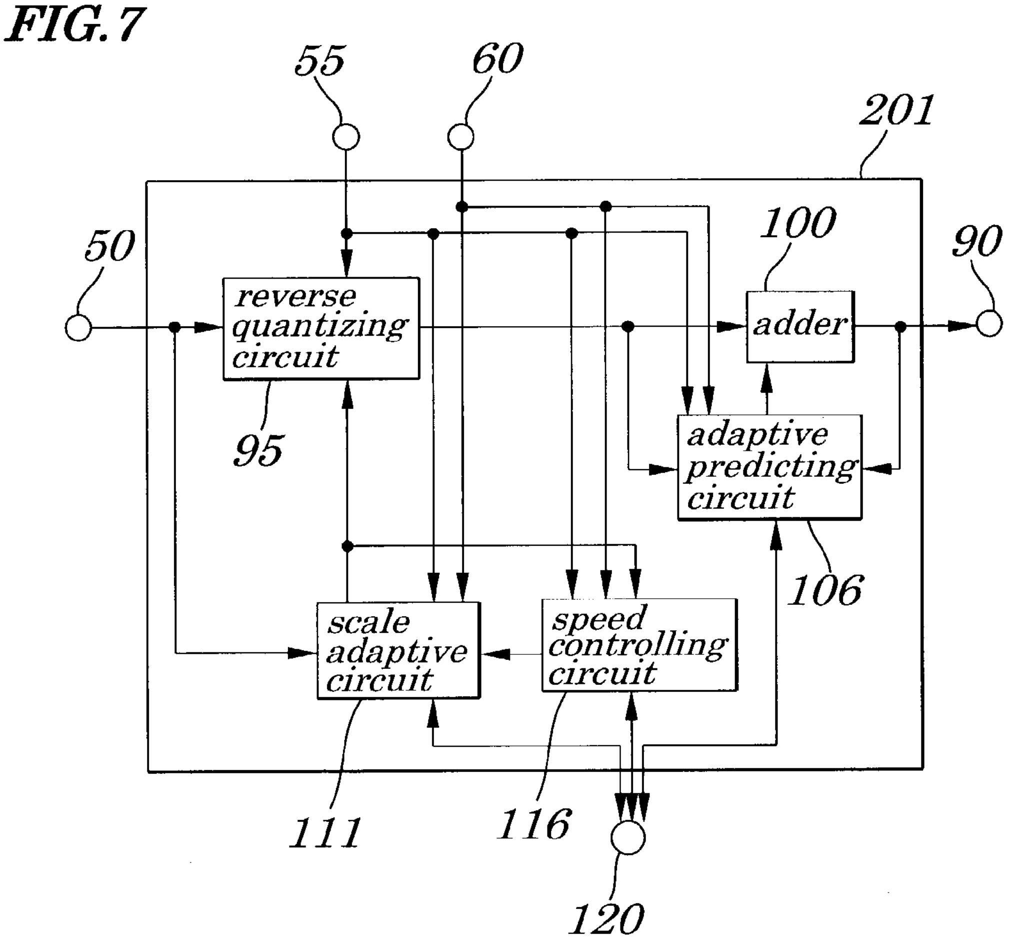
FIG. 7 is a schematic block diagram showing an example of configurations of a decoding circuit employed in the speech decoding device of the second embodiment to which an ADPCM method is applied.
Figure 8:
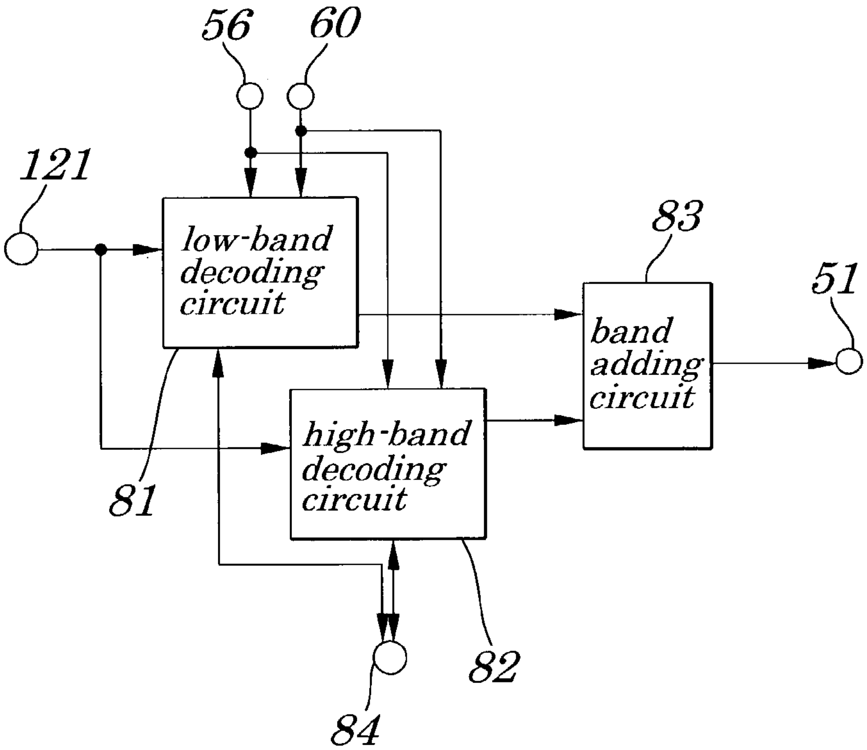
FIG. 8 is a schematic block diagram showing an example of configurations of a decoding circuit employed in the speech decoding device of the second embodiment to which a band-splitting method is applied.

A speech decoding device of a second embodiment of the present invention is described by referring to FIG. 5 to FIG. 8. FIG. 5 is a schematic block diagram showing an example of configurations of the speech decoding device according to the second embodiment. FIG. 6 is a decoding circuit 200 employed in the speech decoding device of the second embodiment to which a CELP method is applied. FIG. 7 is a schematic block diagram showing an example of configurations of a decoding circuit 201 employed in the speech decoding device of the second embodiment to which an ADPCM method is applied. FIG. 8 is a schematic block diagram showing an example of configurations of a decoding circuit employed in the speech decoding device of the second embodiment to which a band-splitting method is applied in which signals in all bands are produced from signals decoded after splitting of a band. Configurations of the decoding device of the second embodiment differ from those in the conventional one shown in FIG. 9 only in that a conventional decoding circuit 30 is replaced with a decoding circuit 33, and a loss measuring circuit 20 is newly provided only operations related to these components are explained accordingly. An input terminal 10 passes loss information not only to the decoding circuit 33 but to the loss measuring circuit 20. The loss measuring circuit 20, by using loss information fed from the input terminal 10, measures a number of times of continuous losses or a length of time of the loss and feeds a result from the measurement to the decoding circuit 33. The decoding circuit 33, unlike in the case of the conventional one, by using not only the loss information fed from the input terminal 10 but also the result from the measurement fed from the loss measuring circuit 20, decodes speech from packets fed from an input terminal 15. More particularly, the decoding circuit 33, if time obtained from the above measurement is longer than a predetermined time, changes an internal signal when speech is decoded from packets that arrived thereafter.

Figure 10:
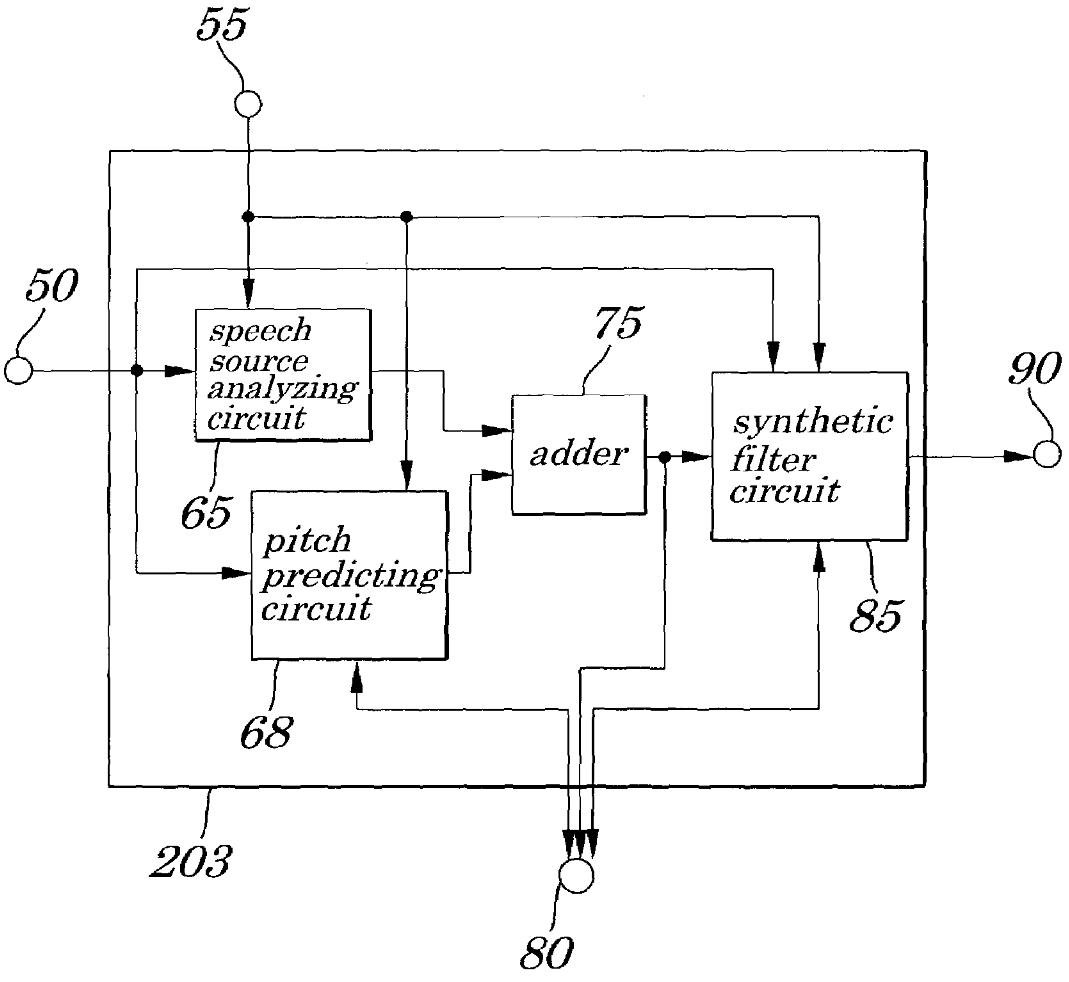
FIG.10 (PRIOR ART)
FIG. 10 is a schematic block diagram showing an example of configurations of a speech decoding circuit employed in a conventional speech decoding device to which a CELP method is applied.

Next, the decoding circuit 33 of the second embodiment is described by referring to FIG. 6 and FIG. 7. First, operations of the decoding circuit 33 performed when the CELP method is employed are described by referring to FIG. 6 in which the decoding circuit 33 shown in FIG. 5 is provided as a decoding circuit 200 in FIG. 6. Configurations of the decoding circuit 200 shown in FIG. 6 differ from those of a conventional CELP-type decoding circuit 203 shown in FIG. 10 in that a speech source analyzing circuit 65, a pitch predicting circuit 68, and a synthetic filter circuit 88 are replaced respectively with a speech source circuit 64, a pitch predicting circuit 69, and a synthetic filter circuit 85 and there is additionally provided with an input terminal 60 to receive a result from measurement of a number of times of loss. Only operations related to these components are explained accordingly. The input terminal 60 receives a result of the measurement and passes it to the speech source circuit 64, the pitch predicting circuit 69, and the synthetic filter circuit 85. Configurations of the speech source circuit 64 of the embodiment differ from those of the conventional speech source analyzing circuit 65 in that, if time being a result from the above measurement fed from the input terminal 60 exceeds a predetermined number of times of loss or a length of time of loss, a speech signal is produced by attenuating a gain of the speech source code vector. An amount of attenuation should be, for example, about 3 dB so as to avoid discontinuous decoded speech. Moreover, the pitch predicting circuit 69 of the embodiment differ from those of the conventional pitch predicting circuit 68 in that, if the result from the measurement fed from the input terminal 60 exceeds the predetermined number of times of loss or the predetermined length of time of loss, a pitch signal is produced by reducing a gain of an adaptive code vector. An amount of attenuation should be, for example, about 3 dB so as to avoid discontinuous decoded speech.

Configurations of the synthetic filter circuit 85 of the embodiment differ from those of the conventional synthetic filter circuit 88 in that, if a result from the measurement fed from the input terminal 60 exceeds the predetermined number of times or the predetermined length of time, filtering is performed after processing of making a spectrum characteristic more flattened has been performed on an LP coefficient of a synthetic filter. As a method for making a spectrum characteristic flattened, a method is available in which a crest of a spectrum is made lower by multiplying an LP coefficient a(i) by $\beta^i$. Here, $\beta<1$. This processing enables reduction of an unwanted voice such as an oscillation sound produced due to a crest of a spectrum possessed by an LP coefficient received in the past.

Figure 11:
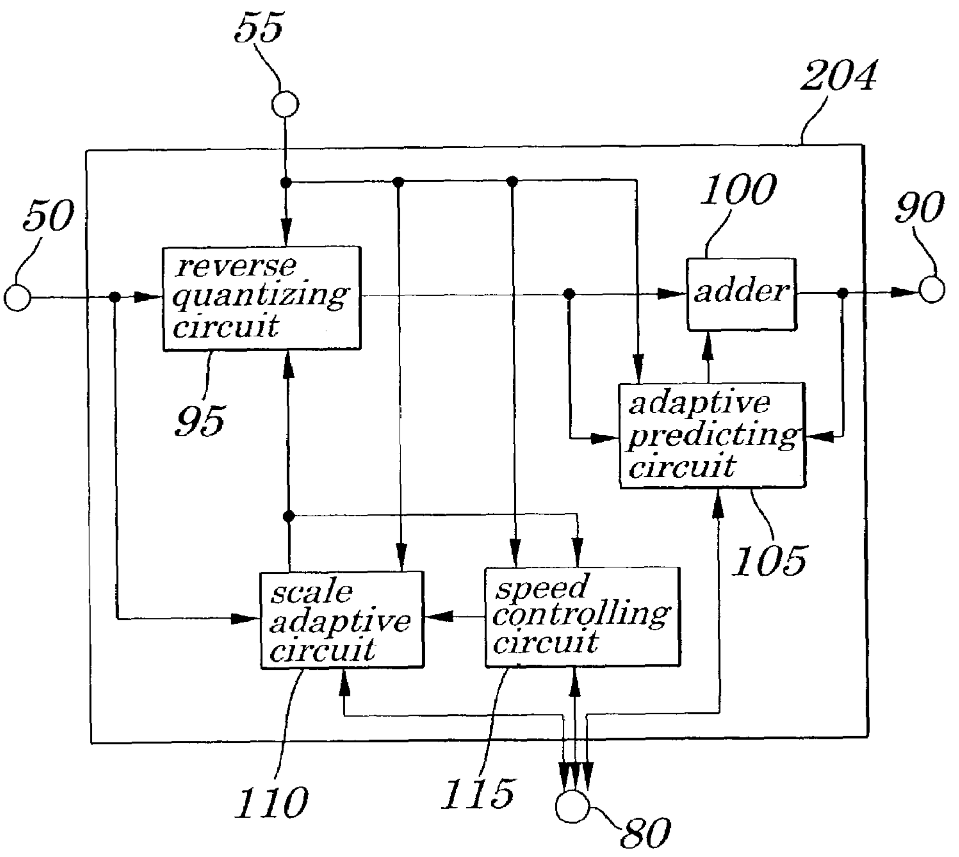
FIG. 11 (PRIOR ART)
FIG. 11 is a schematic block diagram showing an example of configurations of a speech decoding circuit employed in the conventional speech decoding device to which an ADPCM method is applied.

Next, operations of the decoding circuit 33 performed when the ADPCM method is employed are described by referring to FIG. 7 in which the decoding circuit 33 shown in FIG. 7 is provided as a decoding circuit 201. Configurations of the decoding circuit 201 shown in FIG. 7 differ from those of the conventional ADPCM-type decoding circuit 204 shown in FIG. 11 in that a scale adaptive circuit 110, a speed controlling circuit 115, and an adaptive predicting circuit 105 are replaced respectively with a scale adaptive circuit 111, a speed controlling circuit 116, and an adaptive predicting circuit 106, and in that there is additionally provided with an input terminal 60 to receive a result from measurement of a number of times of loss. Only operations related to these components are explained accordingly. The input terminal 60 receives a result of the measurement and passes it to the scale adaptive circuit 111, the speed controlling circuit 116, and the adaptive predicting circuit 106. Configurations of the scale adaptive circuit 111 of the embodiment differ from those of the conventional scale adaptive circuit 110 in that, if a result from the measurement fed from the input terminal 60 exceeds a predetermined number of times of loss or a predetermined length of time of loss, calculations are performed by making a little larger than $2^{-5}$ or $2^{-6}$ of coefficients of a right side of each of the equation (3) and (4) (See Description of the Related Art) described above, during a predetermined time interval (for example, during 5 msec of a head). By making these values larger, an influence on yu(k) and yl(k) incurred by an state existed in the past due to updating of the equations (3) and (4) can be reduced and therefore an influence suffered by loss of a packet can be reduced. By performing this processing during a specified short period of time, the influence suffered by a state existed in the past can be sufficiently reduced. Configurations of the speed controlling circuit 116 of the embodiment differ from those of the conventional speed controlling circuit 115 in that, if a result from the measurement fed from the input terminal 60 exceeds a predetermined number of times of loss or a predetermined length of time of loss, calculations are performed by making a little larger than $2^{-5}$ or $2^{-7}$ of coefficients of a right side of each of the equation (7) and (8) (See Description of the Related Art) described above during a predetermined time interval (for example, during 5 msec of a head). By making these values larger, an influence on dms(k) and dml(k) incurred by an state existed in the past due to updating of the equations (7) and (8) (See Description of the Related Art) can be reduced and therefore an influence suffered by loss of a packet can be reduced. Configurations of the adaptive predicting circuit 106 of the embodiment differ from those of the conventional adaptive predicting circuit 105 in that, if a result from the measurement fed from the input terminal 60 exceeds a predetermined number of times of loss or a predetermined length of time of loss, calculations are performed by making a little larger than $2^{-8}$, $2^{-8}$ or $2^{-7}$ of coefficients of a right side of each of the equation (12), (13) and (14) (See Description of the Related Art) described above, during a predetermined time interval (for example, during 5 msec of a head). By making these values larger, an influence on b(i, k) and a(i, k) incurred by an state existed in the past due to updating of the equations (12) and (14) can be reduced and therefore an influence suffered by loss of a packet can be reduced. Though the processing of making the coefficients larger is performed in the scale adaptive circuit 111, the speed controlling circuit 116, and the adaptive predicting circuit 106, in order to simplify the processing, only any one of the processing executed in these circuits maybe performed. However, effects that can be obtained by the processing decrease.

Lastly, operations of the decoding circuit 33 performed when the band-splitting method is employed are described by referring to FIG. 8. Configurations of the decoding circuit of the embodiment differ from those of the conventional band-splitting type decoding circuit shown in FIG. 12 in that a low-band decoding circuit 66 and a high-band decoding circuit 67 are replaced respectively with a low-band decoding circuit 81, a high-band decoding circuit 82, and there is additionally provided with the input terminal 60 to receive a result from measurement of a number of times of loss. Only operations related to these components are explained accordingly. The input terminal 60 receives a result from the measurement and passes it to the low-band decoding circuit 81 and the high-band decoding circuit 82. Configurations of the low-band decoding circuit 81 of the embodiment differ from those of the conventional low-band decoding circuit 66 in that an internal signal is controlled according to a result from the measurement fed from the input terminal 60. Configurations of the high-band decoding circuit 82 of the embodiment differ from those of the conventional high-band decoding circuit 67 in that an internal signal is controlled according to a result from the measurement fed from the input terminal 60. Here, as the low-band decoding circuit 81 and the high-band decoding circuit 82, the decoding circuits described in FIG. 6 or FIG. 7 may be used.

Moreover, in the speech decoding device of the second embodiment of the present invention, when a length of time during which packets are lost continuously is measured, if a length of time of an interval during which packets are received which exists between two intervals during packets are lost is not greater than a predetermined length of time (for example, 10 msec or a length of time corresponding to one packet), the interval between two intervals during which packets are lost can be regarded as continuous. When packets are lost in a short cycle (for example, every packet), unless each of intervals during which packets are lost in a short cycle is regarded as continuous, and a discontinuous feeling in decoded speech occurs due to changes of interval signals in a short cycle. Therefore, by regarding each of the above intervals as continuous, such the discontinuous feeling in the decoded speech can be prevented.

It is apparent that the present invention is not limited to the above embodiments but may be changed and modified without departing from the scope and spirit of the invention.

What is claimed is:

1. A speech decoding device comprising:

a first circuit to receive a packet and decode speech from the received packet;

a second circuit to store an internal signal produced in the decoding process by said first circuit and to be used by said first circuit in a decoding process for a subsequent packet to be subsequently received;

a third circuit to produce concealed speech corresponding to a packet having not been received using a prior received packet; and a fourth circuit to update said internal signal using said concealed speech, said updating being done at least in part based on a length of time during which no packet has been received continuously, said updating limiting the internal signals such that first decoded speech after the length of time does not take on a large value.

2. The speech decoding device according to claim 1, wherein a code excited linear prediction method is employed and wherein said internal signal contains exciting signals stored as an adaptive code book and prior decoded speech which is to be used in processing by a linear predicting synthetic filter.

3. The speech decoding device according to claim 1, wherein an adaptive differential pulse code modulation method is employed and wherein said internal signal contains a prior output signal which is to be used in predictive processing and coefficients used to control an amplitude or a speed of changing.

4. A speech decoding device comprising:

a decoding circuit to sequentially receive packets containing at least one piece of speech frame data encoded in a block unit for every specified interval in a speech encoding device on a side of a sender, to decode speech frame data in order of packets specified by a time stamp being attached to a received packet, to store an internal signal produced in the decoding process and to be used in a subsequent decoding process for subsequent speech frame data in a buffer, and to produce and output concealed speech corresponding to a packet having not been received, based on said internal signal being stored in said buffer; and an updating circuit to update said internal signal being stored in said buffer using an internal signal obtained by encoding said concealed speech produced in said decoding circuit by a same method employed in said speech encoding device.

5. The speech decoding device according to claim 4, wherein a code excited linear prediction method is employed and wherein said internal signal contains exciting signals stored as an adaptive code book and prior decoded speech which is to be used in processing by a linear predicting synthetic filter.

6. The speech decoding device according to claim 4, wherein an adaptive differential pulse code modulation method is employed and wherein said internal signal contains a prior output signal which is to be used in predictive processing and coefficients used to control an amplitude or a speed of changing.

7. A speech decoding device comprising:

a first circuit to receive a packet and decode speech from the received packet;

a second circuit to store an internal signal produced in the decoding process by said first circuit and to be used by said first circuit in a decoding process for a subsequent packet to be subsequently received;

a third circuit to produce concealed speech corresponding to a packet having not been received by using a prior received packet;

a fourth circuit to measure a length of time during which no receiving of a packet occurs continuously; and a fifth circuit to change said internal signal, when said length of time is longer than a predetermined length of time, to decode speech from a packet received thereafter.

8. The speech decoding device according to claim 7, wherein packets received continuously only within a length of time being shorter than said predetermined length of time are regarded as having not been received in a process of measuring said length of time.

9. The speech decoding device according to claim 7, wherein a code excited linear prediction method is employed and wherein said internal signal contains exciting signals stored as an adaptive code book and prior decoded speech which is to be used in processing by a linear predicting synthetic filter and wherein, in a process of changing said internal signal, a prior signal to be used in predictive processing is made smaller to flatten its spectrum characteristics.

10. The speech decoding device according to claim 7, wherein an adaptive differential pulse Code modulation method is employed and wherein said internal signal contains a prior output signal which is to be used in predictive processing and coefficients used to control an amplitude or a speed of changing and wherein, in a process of changing said internal signal, a prior signal to be used in predictive processing is made smaller to reduce a prior influence exerted on an amplitude or a change of speed.

11. A speech decoding device comprising:

a decoding circuit to sequentially receive packets containing at least one piece of speech frame data encoded in a block unit for every specified interval in a speech encoding device on a side of a sender, to decode speech frame data in order of packets specified by a time stamp attached to a received packet, to store an internal signal produced in the decoding process and to be used in a subsequent decoding process for subsequent speech frame data in a buffer, and to produce and output concealed speech corresponding to a packet having not been received, based on said internal signal being stored in said buffer;

a loss measuring circuit to measure a length of time during which no receiving of a packet occurs continuously; and wherein said decoding circuit is so configured, when said length of time measured by said loss measuring circuit is longer than a predetermined length of time, as to change said internal signal being stored in said buffer for use, to decode speech from a packet received thereafter, said changing of said internal signal limiting the internal signal such that first decoded speech after said length of time does not take on a large value.

12. The speech decoding device according to claim 11, wherein packets received continuously only within a length of time being shorter than said predetermined length of time are regarded as having not been received in a process of measuring said length of time.

13. The speech decoding device according to claim 11, wherein a code excited linear prediction method is employed and wherein said internal signal contains exciting signals stored as an adaptive code book and prior decoded speech which is to be used in processing by a linear predicting synthetic filter and wherein, in a process of changing said internal signal, a prior signal to be used in predictive processing is made smaller to flatten its spectrum characteristics.

14. The speech decoding device according to claim 11, wherein an adaptive differential pulse Code modulation method is employed and wherein said internal signal contains a prior output signal which is to be used in predictive processing and coefficients used to control an amplitude or a speed of changing and wherein, in a process of changing said internal signal, a prior signal to be used in predictive processing is made smaller to reduce a prior influence exerted on an amplitude or a change of speed.

15. A method for decoding speech comprising:

a first step of receiving a packet and decoding speech from the received packet;

a second step of storing an internal signal produced by decoding in said first step and to be used in said first step for decoding of a subsequent packet to be subsequently received;

a third step of producing concealed speech corresponding to a packet having not been received using a prior received packet; and a fourth step of updating said internal signal by using said concealed speech, said updating being done at least in part based on a length of time during which no packet has been received continuously, said updating limiting the internal signals such that first decoded speech after the length of time does not take on a large value.

16. The method for decoding speech according to claim 15, wherein a code excited linear prediction method is employed and wherein said internal signal contains exciting signals stored as an adaptive code book and prior decoded speech which is to be used in processing by a linear predicting synthetic filter.

17. The method for decoding speech according to claim 15, wherein an adaptive differential pulse code modulation method is employed and wherein said internal signal contains a prior output signal which is to be used in predictive processing and coefficients used to control an amplitude or a speed of changing.

18. A method for decoding speech comprising:

a first step of receiving a packet and decoding speech from the received packet;

a second step of storing an internal signal produced by decoding in said first step and to be used in said first step for decoding of a subsequent packet to be subsequently received;

a third step of producing concealed speech corresponding to a packet having not been received using a prior received packet;

a fourth step of measuring a length of time during which no receiving of a packet occurs continuously; and a fifth step of changing said internal signal, when said length of time is longer than a predetermined length of time, to decode speech from a packet received thereafter.

19. The method for decoding speech according to claim 18, wherein, in said fourth step, packets received continuously only within a length of time being shorter than a predetermined length of time are regarded as having not been received in a process of measuring said length of time.

20. The method for decoding speech according to claim 18, wherein a code excited linear prediction method is employed and wherein said internal signal contains exciting signals stored as an adaptive code book and prior decoded speech which is to be used in processing by a linear predicting synthetic filter and wherein, in a process of changing said internal signal, a prior signal to be used in predictive processing is made smaller and a spectrum characteristic is made flattened.

21. The method for decoding speech according to claim 18, wherein an adaptive differential pulse Code modulation method is employed and wherein said internal signal contains a prior output signal which is to be used in predictive processing and coefficients used to control an amplitude or a speed of changing and wherein, in a process of changing said internal signal, a prior signal to be used in predictive processing is made smaller to reduce a prior influence exerted on an amplitude or a speed of changing.

* * * * *